US008856602B2

(12) United States Patent
Brown et al.

(10) Patent No.: US 8,856,602 B2
(45) Date of Patent: Oct. 7, 2014

(54) MULTI-CORE PROCESSOR WITH INTERNAL VOTING-BASED BUILT IN SELF TEST (BIST)

(75) Inventors: Jeffrey D. Brown, Rochester, MN (US); Miguel Comparan, Rochester, MN (US); Robert A. Shearer, Rochester, MN (US); Alfred T. Watson, III, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 150 days.

(21) Appl. No.: 13/330,921

(22) Filed: Dec. 20, 2011

(65) Prior Publication Data

US 2013/0159799 A1    Jun. 20, 2013

(51) Int. Cl.
*G01R 31/28* (2006.01)

(52) U.S. Cl.
USPC ........................................................ 714/726

(58) Field of Classification Search
CPC ............... G01R 31/318536; G01R 31/318541; G01R 31/318572; G01R 31/318555; G01R 31/31926; G01R 31/31715; G01R 31/31723; G01R 31/31724; G01R 31/2834; G01R 31/318522; H05K 999/99
See application file for complete search history.

(56) References Cited

U.S. PATENT DOCUMENTS

| | | | | |
|---|---|---|---|---|
| 5,732,209 A | * | 3/1998 | Vigil et al. | 714/30 |
| 7,263,642 B1 | | 8/2007 | Makar et al. | |
| 7,424,658 B1 | * | 9/2008 | Ghosh Dastidar | 714/738 |
| 7,900,086 B2 | * | 3/2011 | Datta et al. | 714/11 |
| 8,030,649 B2 | | 10/2011 | Gschwind | |
| 2004/0003329 A1 | * | 1/2004 | Cote et al. | 714/726 |
| 2005/0240887 A1 | * | 10/2005 | Rajski et al. | 716/4 |
| 2008/0023700 A1 | * | 1/2008 | Gschwind | 257/48 |
| 2008/0104467 A1 | * | 5/2008 | Satsukawa | 714/729 |
| 2008/0148117 A1 | * | 6/2008 | Seuring | 714/726 |
| 2008/0148120 A1 | * | 6/2008 | Seuring | 714/742 |
| 2009/0013224 A1 | * | 1/2009 | Ziaja et al. | 714/724 |
| 2009/0089636 A1 | * | 4/2009 | Fernsler et al. | 714/728 |
| 2010/0023807 A1 | * | 1/2010 | Wu et al. | 714/30 |
| 2010/0287429 A1 | * | 11/2010 | Maruyama | 714/728 |

OTHER PUBLICATIONS

International Search Report and Written Opinion of the ISA dated Jan. 31, 2013—International Application No. PCT/CN2012/084175.

* cited by examiner

*Primary Examiner* — Albert Decady
*Assistant Examiner* — Enamul M Kabir
(74) *Attorney, Agent, or Firm* — Wood, Herron & Evans, LLP

(57) ABSTRACT

A method and circuit arrangement utilize scan logic disposed on a multi-core processor integrated circuit device or chip to perform internal voting-based built in self test (BIST) of the chip. Test patterns are generated internally on the chip and communicated to the scan chains within multiple processing cores on the chip. Test results output by the scan chains are compared with one another on the chip, and majority voting is used to identify outlier test results that are indicative of a faulty processing core. A bit position in a faulty test result may be used to identify a faulty latch in a scan chain and/or a faulty functional unit in the faulty processing core, and a faulty processing core and/or a faulty functional unit may be automatically disabled in response to the testing.

25 Claims, 7 Drawing Sheets

MULTI-CORE PROCESSOR WITH INTERNAL VOTING-BASED BUILT IN SELF TEST (BIST)

FIELD OF THE INVENTION

The invention is generally related to data processing, and in particular to processor architectures and built in self testing (BIST) of manufactured processor chips.

BACKGROUND OF THE INVENTION

As semiconductor technology continues to inch closer to practical limitations in terms of increases in clock speed, architects are increasingly focusing on parallelism in processor architectures to obtain performance improvements. At the integrated circuit device, or chip level, multiple processing cores are often disposed on the same chip, functioning in much the same manner as separate processor chips, or to some extent, as completely separate computers. In addition, even within cores, parallelism is employed through the use of multiple execution units that are specialized to handle certain types of operations. Pipelining is also employed in many instances so that certain operations that may take multiple clock cycles to perform are broken up into stages, enabling other operations to be started prior to completion of earlier operations. Multithreading is also employed to enable multiple instruction streams to be processed in parallel, enabling more overall work to performed in any given clock cycle.

One effect of the increase in the complexity of processor chips, however, is that testing of the manufactured chips has become significantly more complex and time consuming. Early integrated circuit devices often had enough input/output pins to enable all of the relevant internal operations of a device to be monitored to ensure that the device operated in its intended manner. However, with current designs incorporating millions or billions of transistors and numerous additional high level functions, it is impracticable to provide sufficient input/output connectivity to enable direct monitoring of device operation.

To address these limitations, many integrated circuit devices now incorporate a boundary scan architecture within the logic circuitry of a device to provide access to many of the internal circuits of the device. With a boundary scan architecture, one or more serial scan chains, or scan paths, of latches are coupled to an external port of a device, with individual latches embedded within the logic circuitry of the device at key points of the design. The latches, when not specifically configured to operate as a scan chain, do not otherwise alter the functionality of the device. However, when the latches are configured in a specific mode, the latches together operate as a shift register so that data may be shifted into the chain of latches from a single source to simulate different conditions, and so that data generated within a device may be shifted out through a single output. Thus, with a boundary scan architecture, the current state of various circuits in a device at any given time may be recorded and later accessed via external equipment to verify the operation of a manufactured device.

The need to utilize external equipment to perform testing of integrated circuit devices, however, can be a significant burden, particularly for high volume parts. Due to the relatively lower speed of external testing interfaces, a tradeoff often must be made between performing thorough testing that may take several minutes to perform vs. performing a more superficial test in less time, and risking faulty parts being misidentified as good. Furthermore, the need to utilize external equipment often precludes re-testing chips in the field to determine if a new fail has occurred.

Therefore, a significant need continues to exist in the art for a manner of efficiently and cost-effectively testing complex integrated circuit devices such as processor chips and the like.

SUMMARY OF THE INVENTION

The invention addresses these and other problems associated with the prior art by providing a method and circuit arrangement that utilize scan logic disposed on a multi-core processor integrated circuit device or chip to perform internal voting-based built in self test (BIST) of the chip. Test patterns are generated internally on the chip and communicated to the scan chains within multiple processing cores on the chip. Test results output by the scan chains are compared with one another on the chip, and majority voting is used to identify outlier test results that are indicative of a faulty processing core. In some embodiments, a bit position in a faulty test result is used to identify a faulty latch in a scan chain and/or a faulty functional unit in the faulty processing core, and in some embodiments a faulty processing core and/or a faulty functional unit may be automatically disabled in response to the testing.

Consistent with one aspect of the invention, built in self test (BIST) is performed for a multi-core integrated circuit device of the type including a plurality of processing cores, where each processing core includes a scan chain. Scan logic disposed on the multi-core integrated circuit device communicates a test pattern to the scan chains of the plurality of processing cores and compares test results output by the scan chains of the plurality of processing cores in response to the test pattern using the scan logic. A faulty processing core among the plurality of processing cores is then identified based upon the test result output by the scan chain of the faulty processing core differing from a majority of the test results output by the plurality of processing cores.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
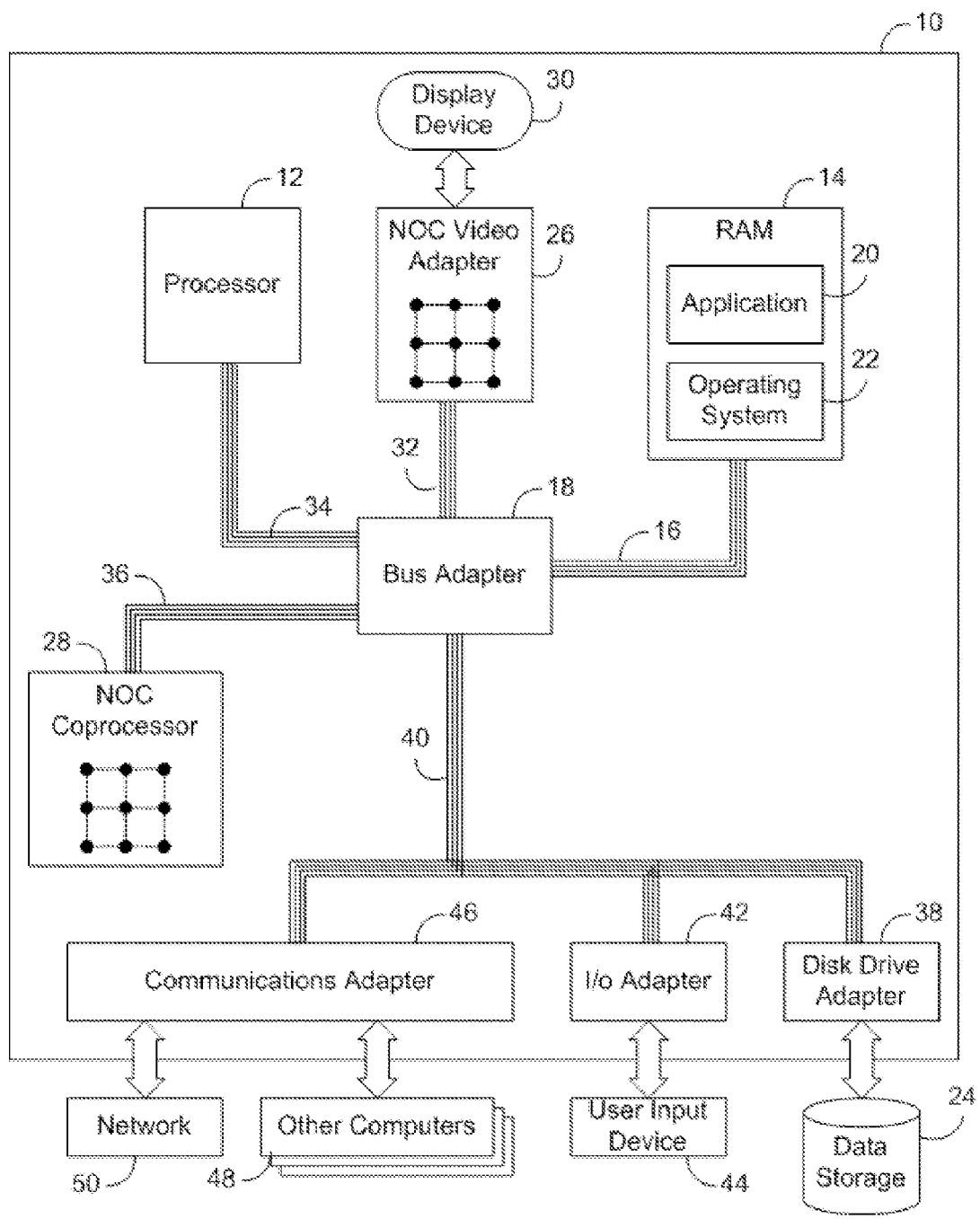
FIG. 1 is a block diagram of exemplary automated computing machinery including an exemplary computer useful in data processing consistent with embodiments of the present invention.

Embodiments consistent with the invention utilize scan logic disposed on a multi-core processor integrated circuit device or chip to perform internal voting-based built in self test (BIST) of the chip. Test patterns are generated internally on the chip and communicated to the scan chains within multiple processing cores on the chip. Test results output by the scan chains are compared with one another on the chip, and majority voting is used to identify outlier test results that are indicative of a faulty processing core.

A multi-core processor integrated circuit device or chip consistent with the invention includes a plurality of processing cores that are functional duplicates of one another such that, in response to the same input being input to the scan chains of the processing cores, as well as the processing cores being clocked the same number of clock cycles, the test results output by the scan chains of the processing cores are identical in the absence of a fault in any of the processing cores. A processing core typically includes a plurality of functional units, including, for example, an issue unit, a fixed point execution unit, a floating point execution unit or other auxiliary execution unit or accelerator, one or more levels of on-board cache such as an L1 and/or L2 cache, etc., although it will be appreciated that practically any circuit logic that is disposed within a processing core and that is capable of being tested via BIST can be considered a functional unit for the purposes of the invention.

A processing core also includes one or more scan chains, which are typically, but not necessarily, implemented as a plurality of latches connected in series, such that data can be scanned into and out of a scan chain bit-by-bit, one bit per clock cycle. For the purposes of the invention, a scan chain may include any number of latches, grouped in any number of subsets or groups, distributed in any number of functional units, and including an input for receiving test patterns and an output for outputting test results generated from such test patterns. A test result typically represents the data stored in the scan chain after the processing core, or at least a portion thereof, has been clocked one or more cycles after a test pattern has been scanned into the scan chain.

Scan logic, disposed internally in a multi-core processor chip, is configured to generate test patterns, e.g., pseudorandom test patterns as might be generated by a linear feedback shift register (LFSR) or other pseudorandom logic. Alternatively, the scan logic may generate predetermined test patterns, e.g., in a predetermined sequence. The predetermined test patterns may be generated by dedicated logic, stored in a volatile or non-volatile memory array, or loaded into the processing core prior to testing. It may be desirable, for example, to determine during the design process a sequence of test patterns suitable for thoroughly and efficiently testing a particular processing core design and then incorporate those test patterns into the design of the scan logic.

The scan logic also desirably includes comparison logic that is configured to implement a voting algorithm that identifies a faulty processing core based upon a test result output by the scan chain of that processing core differing from a majority of the test results output by the processing cores being tested. Put another way, the "correct" test result is determined as the test result that is returned by a majority of the processing cores, so any processing core that returns a test result that differs from the majority consensus may be identified as being faulty.

Moreover, the comparison logic typically operates on-the-fly as test result data is output by the scan chains of the processing cores, such that, in the event that serial scan chains are implemented, the outputs of the scan chains may be compared on a bit-by-bit basis. As such, any processing core outputting a bit that differs from the consensus of the majority of the processing cores may be identified as being faulty. Furthermore, by monitoring the position of each bit in the test result, the latch from which the faulty bit was obtained may be identified, and in embodiments where the locations of the latches in a processing core are known, e.g., via a mapping table resident on the chip, the functional unit within which the latch is disposed may also be identified.

The identification of a faulty or failing functional unit may also be used to automatically configure a multi-core processor chip in some embodiments of the invention. For example, where electronic fuses are used to selectively enable or disable processing cores or even individual functional units in processing cores, the identification of a faulty functional unit may be used by the scan logic to automatically disable a functional unit or a processing core, e.g., by blowing an electronic fuse.

Scan logic consistent with the invention may perform a comparison of the test results output by all of the processing cores on a chip, or in the alternative, may include multiple instances that are configured to test subsets or groups of processing cores in parallel. For example, processing cores may be grouped into groups of as few as three processing cores, such that a processing core that returns a test result that differs from the other two processing cores in the group would be identified as being faulty, with sufficient instances of the scan logic provided to adequately test all of the processing cores on the chip. It will also be appreciated that common test pattern generation logic may be used to output test patterns to all of the processing cores even when different instances of the scan logic are used to compare groups of processing cores. Furthermore, it will be appreciated that where multiple types of redundant groups of processing cores are disposed on the same chip, different test patterns may be used to test the different groups of processing cores.

Other variations and modifications will be apparent to one of ordinary skill in the art. Therefore, the invention is not limited to the specific implementations discussed herein.

Hardware and Software Environment

Now turning to the drawings, wherein like numbers denote like parts throughout the several views, FIG. 1 illustrates exemplary automated computing machinery including an exemplary computer 10 useful in data processing consistent with embodiments of the present invention. Computer 10 of FIG. 1 includes at least one computer processor 12 or 'CPU' as well as random access memory 14 ('RAM'), which is connected through a high speed memory bus 16 and bus adapter 18 to processor 12 and to other components of the computer 10.

Stored in RAM 14 is an application program 20, a module of user-level computer program instructions for carrying out particular data processing tasks such as, for example, word processing, spreadsheets, database operations, video gaming, stock market simulations, atomic quantum process simulations, or other user-level applications. Also stored in RAM 14 is an operating system 22. Operating systems useful in connection with embodiments of the invention include UNIX™, Linux™, Microsoft Windows XP™, AIX™, IBM's i5/OS™, and others as will occur to those of skill in the art. Operating system 22 and application 20 in the example of FIG. 1 are shown in RAM 14, but many components of such software typically are stored in non-volatile memory also, e.g., on a disk drive 24.

As will become more apparent below, embodiments consistent with the invention may be implemented within Network On Chip (NOC) integrated circuit devices, or chips, and as such, computer 10 is illustrated including two exemplary NOCs: a video adapter 26 and a coprocessor 28. NOC video adapter 26, which may alternatively be referred to as a graphics adapter, is an example of an I/O adapter specially designed for graphic output to a display device 30 such as a display screen or computer monitor. NOC video adapter 26 is connected to processor 12 through a high speed video bus 32, bus adapter 18, and the front side bus 34, which is also a high speed bus. NOC Coprocessor 28 is connected to processor 12 through bus adapter 18, and front side buses 34 and 36, which is also a high speed bus. The NOC coprocessor of FIG. 1 may be optimized, for example, to accelerate particular data processing tasks at the behest of the main processor 12.

The exemplary NOC video adapter 26 and NOC coprocessor 28 of FIG. 1 each include a NOC, including integrated processor ('IP') blocks, routers, memory communications controllers, and network interface controllers, the details of which will be discussed in greater detail below in connection with FIGS. 2-3. The NOC video adapter and NOC coprocessor are each optimized for programs that use parallel processing and also require fast random access to shared memory. It will be appreciated by one of ordinary skill in the art having the benefit of the instant disclosure, however, that the invention may be implemented in devices and device architectures other than NOC devices and device architectures. The invention is therefore not limited to implementation within an NOC device.

Computer 10 of FIG. 1 includes disk drive adapter 38 coupled through an expansion bus 40 and bus adapter 18 to processor 12 and other components of the computer 10. Disk drive adapter 38 connects non-volatile data storage to the computer 10 in the form of disk drive 24, and may be implemented, for example, using Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

Computer 10 also includes one or more input/output ('I/O') adapters 42, which implement user-oriented input/output through, for example, software drivers and computer hardware for controlling output to display devices such as computer display screens, as well as user input from user input devices 44 such as keyboards and mice. In addition, computer 10 includes a communications adapter 46 for data communications with other computers 48 and for data communications with a data communications network 50. Such data communications may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters suitable for use in computer 10 include modems for wired dial-up communications, Ethernet (IEEE 802.3) adapters for wired data communications network communications, and 802.11 adapters for wireless data communications network communications.

Figure 2:
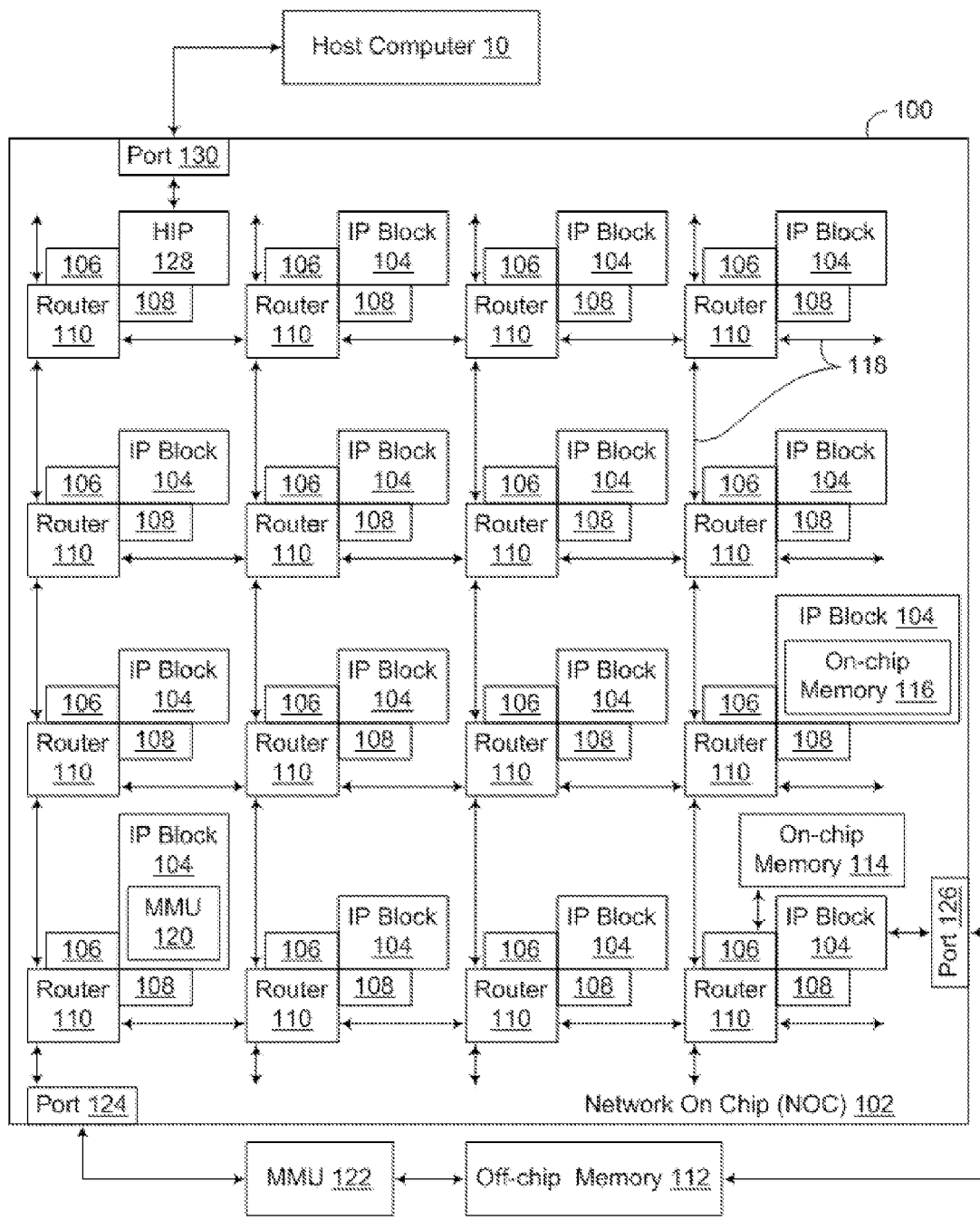
FIG. 2 is a block diagram of an exemplary NOC implemented in the computer of FIG. 1.

For further explanation, FIG. 2 sets forth a functional block diagram of an example NOC 102 according to embodiments of the present invention. The NOC in FIG. 2 is implemented on a 'chip' 100, that is, on an integrated circuit. NOC 102 includes integrated processor ('IP') blocks 104, routers 110, memory communications controllers 106, and network interface controllers 108 grouped into interconnected nodes. Each IP block 104 is adapted to a router 110 through a memory communications controller 106 and a network interface controller 108. Each memory communications controller controls communications between an IP block and memory, and each network interface controller 108 controls inter-IP block communications through routers 110.

In NOC 102, each IP block represents a reusable unit of synchronous or asynchronous logic design used as a building block for data processing within the NOC. The term 'IP block' is sometimes expanded as 'intellectual property block,' effectively designating an IP block as a design that is owned by a party, that is the intellectual property of a party, to be licensed to other users or designers of semiconductor circuits. In the scope of the present invention, however, there is no requirement that IP blocks be subject to any particular ownership, so the term is always expanded in this specification as 'integrated processor block.' IP blocks, as specified here, are reusable units of logic, cell, or chip layout design that may or may not be the subject of intellectual property. IP blocks are logic cores that can be formed as ASIC chip designs or FPGA logic designs.

One way to describe IP blocks by analogy is that IP blocks are for NOC design what a library is for computer programming or a discrete integrated circuit component is for printed circuit board design. In NOCs consistent with embodiments of the present invention, IP blocks may be implemented as generic gate netlists, as complete special purpose or general purpose microprocessors, or in other ways as may occur to those of skill in the art. A netlist is a Boolean-algebra representation (gates, standard cells) of an IP block's logical-function, analogous to an assembly-code listing for a high-level program application. NOCs also may be implemented, for example, in synthesizable form, described in a hardware description language such as Verilog or VHDL. In addition to netlist and synthesizable implementation, NOCs also may be delivered in lower-level, physical descriptions. Analog IP block elements such as SERDES, PLL, DAC, ADC, and so on, may be distributed in a transistor-layout format such as GDSII. Digital elements of IP blocks are sometimes offered in layout format as well. It will also be appreciated that IP blocks, as well as other logic circuitry implemented consistent with the invention may be distributed in the form of computer data files, e.g., logic definition program code, that define at various levels of detail the functionality and/or layout of the circuit arrangements implementing such logic. Thus, while the invention has and hereinafter will be described in the context of circuit arrangements implemented in fully functioning integrated circuit devices, data processing systems utilizing such devices, and other tangible, physical hardware circuits, those of ordinary skill in the art having the benefit of the instant disclosure will appreciate that the invention may also be implemented within a program product, and that the invention applies equally regardless of the particular type of computer readable storage medium being used to distribute the program product. Examples of computer readable storage media include, but are not limited to, physical, recordable type media such as volatile and non-volatile memory devices, floppy disks, hard disk drives, CD-ROMs, and DVDs (among others).

Each IP block 104 in the example of FIG. 2 is adapted to a router 110 through a memory communications controller 106. Each memory communication controller is an aggregation of synchronous and asynchronous logic circuitry adapted to provide data communications between an IP block and memory. Examples of such communications between IP blocks and memory include memory load instructions and memory store instructions. The memory communications controllers 106 are described in more detail below with reference to FIG. 3. Each IP block 104 is also adapted to a router 110 through a network interface controller 108, which controls communications through routers 110 between IP blocks 104. Examples of communications between IP blocks include messages carrying data and instructions for processing the data among IP blocks in parallel applications and in pipelined applications. The network interface controllers 108 are also described in more detail below with reference to FIG. 3.

Routers 110, and the corresponding links 118 therebetween, implement the network operations of the NOC. The links 118 may be packet structures implemented on physical, parallel wire buses connecting all the routers. That is, each link may be implemented on a wire bus wide enough to accommodate simultaneously an entire data switching packet, including all header information and payload data. If a packet structure includes 64 bytes, for example, including an eight byte header and 56 bytes of payload data, then the wire bus subtending each link is 64 bytes wide, 512 wires. In addition, each link may be bi-directional, so that if the link packet structure includes 64 bytes, the wire bus actually contains 1024 wires between each router and each of its neighbors in the network. In such an implementation, a message could include more than one packet, but each packet would fit precisely onto the width of the wire bus. In the alternative, a link may be implemented on a wire bus that is only wide enough to accommodate a portion of a packet, such that a packet would be broken up into multiple beats, e.g., so that if a link is implemented as 16 bytes in width, or 128 wires, a 64 byte packet could be broken into four beats. It will be appreciated that different implementations may used different bus widths based on practical physical limits as well as desired performance characteristics. If the connection between the router and each section of wire bus is referred to as a port, then each router includes five ports, one for each of four directions of data transmission on the network and a fifth port for adapting the router to a particular IP block through a memory communications controller and a network interface controller.

Each memory communications controller 106 controls communications between an IP block and memory. Memory can include off-chip main RAM 112, memory 114 connected directly to an IP block through a memory communications controller 106, on-chip memory enabled as an IP block 116, and on-chip caches. In NOC 102, either of the on-chip memories 114, 116, for example, may be implemented as on-chip cache memory. All these forms of memory can be disposed in the same address space, physical addresses or virtual addresses, true even for the memory attached directly to an IP block. Memory addressed messages therefore can be entirely bidirectional with respect to IP blocks, because such memory can be addressed directly from any IP block anywhere on the network. Memory 116 on an IP block can be addressed from that IP block or from any other IP block in the NOC. Memory 114 attached directly to a memory communication controller can be addressed by the IP block that is adapted to the network by that memory communication controller—and can also be addressed from any other IP block anywhere in the NOC.

NOC 102 includes two memory management units ('MMUs') 120, 122, illustrating two alternative memory architectures for NOCs consistent with embodiments of the present invention. MMU 120 is implemented within an IP block, allowing a processor within the IP block to operate in virtual memory while allowing the entire remaining architecture of the NOC to operate in a physical memory address space. MMU 122 is implemented off-chip, connected to the NOC through a data communications port 124. The port 124 includes the pins and other interconnections required to conduct signals between the NOC and the MMU, as well as sufficient intelligence to convert message packets from the NOC packet format to the bus format required by the external MMU 122. The external location of the MMU means that all processors in all IP blocks of the NOC can operate in virtual memory address space, with all conversions to physical addresses of the off-chip memory handled by the off-chip MMU 122.

In addition to the two memory architectures illustrated by use of the MMUs 120, 122, data communications port 126 illustrates a third memory architecture useful in NOCs capable of being utilized in embodiments of the present invention. Port 126 provides a direct connection between an IP block 104 of the NOC 102 and off-chip memory 112. With no MMU in the processing path, this architecture provides utilization of a physical address space by all the IP blocks of the NOC. In sharing the address space bi-directionally, all the IP blocks of the NOC can access memory in the address space by memory-addressed messages, including loads and stores, directed through the IP block connected directly to the port 126. The port 126 includes the pins and other interconnections required to conduct signals between the NOC and the off-chip memory 112, as well as sufficient intelligence to convert message packets from the NOC packet format to the bus format required by the off-chip memory 112.

In the example of FIG. 2, one of the IP blocks is designated a host interface processor 128. A host interface processor 128 provides an interface between the NOC and a host computer 10 in which the NOC may be installed and also provides data processing services to the other IP blocks on the NOC, including, for example, receiving and dispatching among the IP blocks of the NOC data processing requests from the host computer. A NOC may, for example, implement a video graphics adapter 26 or a coprocessor 28 on a larger computer 10 as described above with reference to FIG. 1. In the example of FIG. 2, the host interface processor 128 is connected to the larger host computer through a data communications port 130. The port 130 includes the pins and other interconnections required to conduct signals between the NOC and the host computer, as well as sufficient intelligence to convert message packets from the NOC to the bus format required by the host computer 10. In the example of the NOC coprocessor in the computer of FIG. 1, such a port would provide data communications format translation between the link structure of the NOC coprocessor 28 and the protocol required for the front side bus 36 between the NOC coprocessor 28 and the bus adapter 18.

Figure 3:
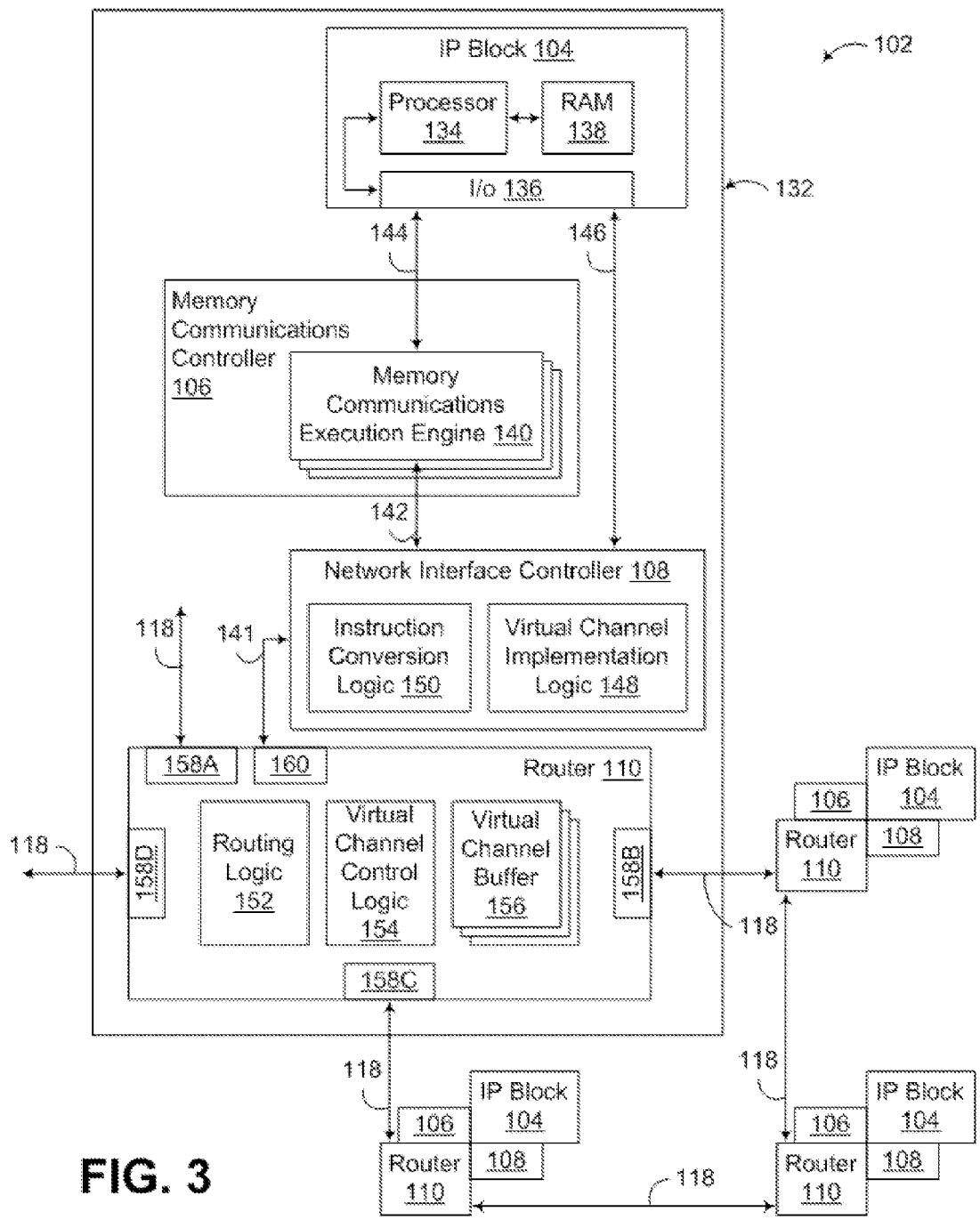
FIG. 3 is a block diagram illustrating in greater detail an exemplary implementation of a node from the NOC of FIG. 2.

FIG. 3 next illustrates a functional block diagram illustrating in greater detail the components implemented within an IP block 104, memory communications controller 106, network interface controller 108 and router 110 in NOC 102, collectively illustrated at 132. IP block 104 includes a computer processor 134 and I/O functionality 136. In this example, computer memory is represented by a segment of random access memory ('RAM') 138 in IP block 104. The memory, as described above with reference to FIG. 2, can occupy segments of a physical address space whose contents on each IP block are addressable and accessible from any IP block in the NOC. The processors 134, I/O capabilities 136, and memory 138 in each IP block effectively implement the IP blocks as generally programmable microcomputers. As explained above, however, in the scope of the present invention, IP blocks generally represent reusable units of synchronous or asynchronous logic used as building blocks for data processing within a NOC. Implementing IP blocks as generally programmable microcomputers, therefore, although a common embodiment useful for purposes of explanation, is not a limitation of the present invention.

In NOC 102 of FIG. 3, each memory communications controller 106 includes a plurality of memory communications execution engines 140. Each memory communications execution engine 140 is enabled to execute memory communications instructions from an IP block 104, including bidirectional memory communications instruction flow 141, 142, 144 between the network and the IP block 104. The memory communications instructions executed by the memory communications controller may originate, not only from the IP block adapted to a router through a particular memory communications controller, but also from any IP block 104 anywhere in NOC 102. That is, any IP block in the NOC can generate a memory communications instruction and transmit that memory communications instruction through the routers of the NOC to another memory communications controller associated with another IP block for execution of that memory communications instruction. Such memory communications instructions can include, for example, translation lookaside buffer control instructions, cache control instructions, barrier instructions, and memory load and store instructions.

Each memory communications execution engine 140 is enabled to execute a complete memory communications instruction separately and in parallel with other memory communications execution engines. The memory communications execution engines implement a scalable memory transaction processor optimized for concurrent throughput of memory communications instructions. Memory communications controller 106 supports multiple memory communications execution engines 140 all of which run concurrently for simultaneous execution of multiple memory communications instructions. A new memory communications instruction is allocated by the memory communications controller 106 to a memory communications engine 140 and memory communications execution engines 140 can accept multiple response events simultaneously. In this example, all of the memory communications execution engines 140 are identical. Scaling the number of memory communications instructions that can be handled simultaneously by a memory communications controller 106, therefore, is implemented by scaling the number of memory communications execution engines 140.

In NOC 102 of FIG. 3, each network interface controller 108 is enabled to convert communications instructions from command format to network packet format for transmission among the IP blocks 104 through routers 110. The communications instructions may be formulated in command format by the IP block 104 or by memory communications controller 106 and provided to the network interface controller 108 in command format. The command format may be a native format that conforms to architectural register files of IP block 104 and memory communications controller 106. The network packet format is typically the format required for transmission through routers 110 of the network. Each such message is composed of one or more network packets. Examples of such communications instructions that are converted from command format to packet format in the network interface controller include memory load instructions and memory store instructions between IP blocks and memory. Such communications instructions may also include communications instructions that send messages among IP blocks carrying data and instructions for processing the data among IP blocks in parallel applications and in pipelined applications.

In NOC 102 of FIG. 3, each IP block is enabled to send memory-address-based communications to and from memory through the IP block's memory communications controller and then also through its network interface controller to the network. A memory-address-based communications is a memory access instruction, such as a load instruction or a store instruction, that is executed by a memory communication execution engine of a memory communications controller of an IP block. Such memory-address-based communications typically originate in an IP block, formulated in command format, and handed off to a memory communications controller for execution.

Many memory-address-based communications are executed with message traffic, because any memory to be accessed may be located anywhere in the physical memory address space, on-chip or off-chip, directly attached to any memory communications controller in the NOC, or ultimately accessed through any IP block of the NOC—regardless of which IP block originated any particular memory-address-based communication. Thus, in NOC 102, all memory-address-based communications that are executed with message traffic are passed from the memory communications controller to an associated network interface controller for conversion from command format to packet format and transmission through the network in a message. In converting to packet format, the network interface controller also identifies a network address for the packet in dependence upon the memory address or addresses to be accessed by a memory-address-based communication. Memory address based messages are addressed with memory addresses. Each memory address is mapped by the network interface controllers to a network address, typically the network location of a memory communications controller responsible for some range of physical memory addresses. The network location of a memory communication controller 106 is naturally also the network location of that memory communication controller's associated router 110, network interface controller 108, and IP block 104. The instruction conversion logic 150 within each network interface controller is capable of converting memory addresses to network addresses for purposes of transmitting memory-address-based communications through routers of a NOC.

Upon receiving message traffic from routers 110 of the network, each network interface controller 108 inspects each packet for memory instructions. Each packet containing a memory instruction is handed to the memory communications controller 106 associated with the receiving network interface controller, which executes the memory instruction before sending the remaining payload of the packet to the IP block for further processing. In this way, memory contents are always prepared to support data processing by an IP block before the IP block begins execution of instructions from a message that depend upon particular memory content.

In NOC 102 of FIG. 3, each IP block 104 is enabled to bypass its memory communications controller 106 and send inter-IP block, network-addressed communications 146 directly to the network through the IP block's network interface controller 108. Network-addressed communications are messages directed by a network address to another IP block. Such messages transmit working data in pipelined applications, multiple data for single program processing among IP blocks in a SIMD application, and so on, as will occur to those of skill in the art. Such messages are distinct from memory-address-based communications in that they are network addressed from the start, by the originating IP block which knows the network address to which the message is to be directed through routers of the NOC. Such network-addressed communications are passed by the IP block through I/O functions 136 directly to the IP block's network interface controller in command format, then converted to packet format by the network interface controller and transmitted through routers of the NOC to another IP block. Such network-addressed communications 146 are bi-directional, potentially proceeding to and from each IP block of the NOC, depending on their use in any particular application. Each network interface controller, however, is enabled to both send and receive such communications to and from an associated router, and each network interface controller is enabled to both send and receive such communications directly to and from an associated IP block, bypassing an associated memory communications controller 106.

Each network interface controller 108 in the example of FIG. 3 is also enabled to implement virtual channels on the network, characterizing network packets by type. Each network interface controller 108 includes virtual channel implementation logic 148 that classifies each communication instruction by type and records the type of instruction in a field of the network packet format before handing off the instruction in packet form to a router 110 for transmission on the NOC. Examples of communication instruction types include inter-IP block network-address-based messages, request messages, responses to request messages, invalidate messages directed to caches; memory load and store messages; and responses to memory load messages, etc.

Each router 110 in the example of FIG. 3 includes routing logic 152, virtual channel control logic 154, and virtual channel buffers 156. The routing logic typically is implemented as a network of synchronous and asynchronous logic that implements a data communications protocol stack for data communication in the network formed by the routers 110, links 118, and bus wires among the routers. Routing logic 152 includes the functionality that readers of skill in the art might associate in off-chip networks with routing tables, routing tables in at least some embodiments being considered too slow and cumbersome for use in a NOC. Routing logic implemented as a network of synchronous and asynchronous logic can be configured to make routing decisions as fast as a single clock cycle. The routing logic in this example routes packets by selecting a port for forwarding each packet received in a router. Each packet contains a network address to which the packet is to be routed.

In describing memory-address-based communications above, each memory address was described as mapped by network interface controllers to a network address, a network location of a memory communications controller. The network location of a memory communication controller 106 is naturally also the network location of that memory communication controller's associated router 110, network interface controller 108, and IP block 104. In inter-IP block, or network-address-based communications, therefore, it is also typical for application-level data processing to view network addresses as the location of an IP block within the network formed by the routers, links, and bus wires of the NOC. FIG. 2 illustrates that one organization of such a network is a mesh of rows and columns in which each network address can be implemented, for example, as either a unique identifier for each set of associated router, IP block, memory communications controller, and network interface controller of the mesh or x, y coordinates of each such set in the mesh.

In NOC 102 of FIG. 3, each router 110 implements two or more virtual communications channels, where each virtual communications channel is characterized by a communication type. Communication instruction types, and therefore virtual channel types, include those mentioned above: inter-IP block network-address-based messages, request messages, responses to request messages, invalidate messages directed to caches; memory load and store messages; and responses to memory load messages, and so on. In support of virtual channels, each router 110 in the example of FIG. 3 also includes virtual channel control logic 154 and virtual channel buffers 156. The virtual channel control logic 154 examines each received packet for its assigned communications type and places each packet in an outgoing virtual channel buffer for that communications type for transmission through a port to a neighboring router on the NOC.

Each virtual channel buffer 156 has finite storage space. When many packets are received in a short period of time, a virtual channel buffer can fill up—so that no more packets can be put in the buffer. In other protocols, packets arriving on a virtual channel whose buffer is full would be dropped. Each virtual channel buffer 156 in this example, however, is enabled with control signals of the bus wires to advise surrounding routers through the virtual channel control logic to suspend transmission in a virtual channel, that is, suspend transmission of packets of a particular communications type. When one virtual channel is so suspended, all other virtual channels are unaffected—and can continue to operate at full capacity. The control signals are wired all the way back through each router to each router's associated network interface controller 108. Each network interface controller is configured to, upon receipt of such a signal, refuse to accept, from its associated memory communications controller 106 or from its associated IP block 104, communications instructions for the suspended virtual channel. In this way, suspension of a virtual channel affects all the hardware that implements the virtual channel, all the way back up to the originating IP blocks.

One effect of suspending packet transmissions in a virtual channel is that no packets are ever dropped. When a router encounters a situation in which a packet might be dropped in some unreliable protocol such as, for example, the Internet Protocol, the routers in the example of FIG. 3 may suspend by their virtual channel buffers 156 and their virtual channel control logic 154 all transmissions of packets in a virtual channel until buffer space is again available, eliminating any need to drop packets. The NOC of FIG. 3, therefore, may implement highly reliable network communications protocols with an extremely thin layer of hardware.

The example NOC of FIG. 3 may also be configured to maintain cache coherency between both on-chip and off-chip memory caches. Each NOC can support multiple caches each of which operates against the same underlying memory address space. For example, caches may be controlled by IP blocks, by memory communications controllers, or by cache controllers external to the NOC. Either of the on-chip memories 114, 116 in the example of FIG. 2 may also be implemented as an on-chip cache, and, within the scope of the present invention, cache memory can be implemented off-chip also.

Each router 110 illustrated in FIG. 3 includes five ports, four ports 158A-D connected through bus wires 118 to other routers and a fifth port 160 connecting each router to its associated IP block 104 through a network interface controller 108 and a memory communications controller 106. As can be seen from the illustrations in FIGS. 2 and 3, the routers 110 and the links 118 of the NOC 102 form a mesh network with vertical and horizontal links connecting vertical and horizontal ports in each router. In the illustration of FIG. 3, for example, ports 158A, 158C and 160 are termed vertical ports, and ports 158B and 158D are termed horizontal ports.

Figure 4:
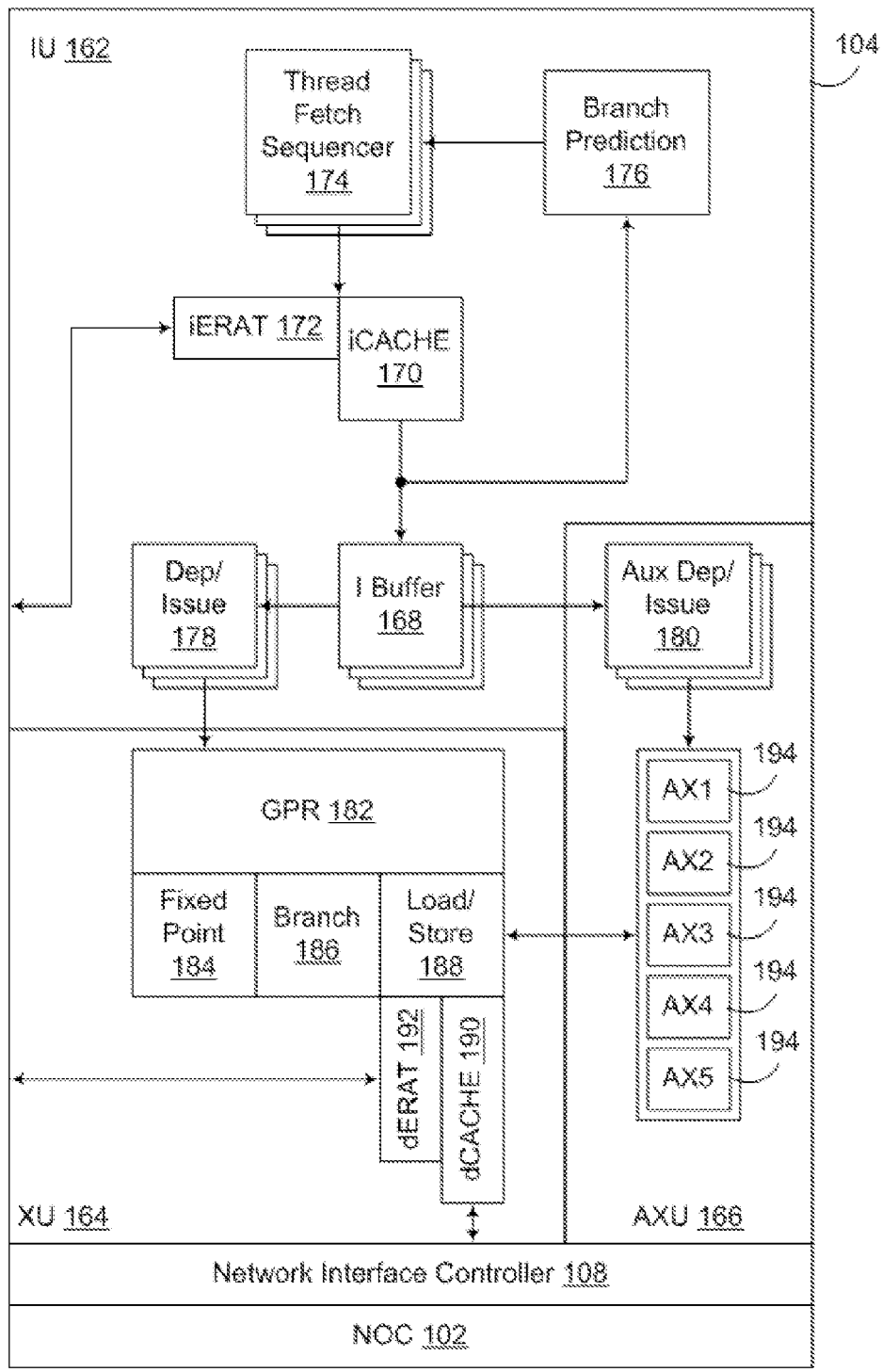
FIG. 4 is a block diagram illustrating an exemplary implementation of an IP block from the NOC of FIG. 2.

FIG. 4 next illustrates in another manner one exemplary implementation of an IP block 104 consistent with the invention, implemented as a processing element partitioned into an issue or instruction unit (IU) 162, execution unit (XU) 164 and auxiliary execution unit (AXU) 166. In the illustrated implementation, IU 162 includes a plurality of instruction buffers 168 that receive instructions from an L1 instruction cache (iCACHE) 170. Each instruction buffer 168 is dedicated to one of a plurality, e.g., four, symmetric multithreaded (SMT) hardware threads. An effective-to-real translation unit (iERAT) 172 is coupled to iCACHE 170, and is used to translate instruction fetch requests from a plurality of thread fetch sequencers 174 into real addresses for retrieval of instructions from lower order memory. Each thread fetch sequencer 174 is dedicated to a particular hardware thread, and is used to ensure that instructions to be executed by the associated thread is fetched into the iCACHE for dispatch to the appropriate execution unit. As also shown in FIG. 4, instructions fetched into instruction buffer 168 may also be monitored by branch prediction logic 176, which provides hints to each thread fetch sequencer 174 to minimize instruction cache misses resulting from branches in executing threads.

IU 162 also includes a dependency/issue logic block 178 dedicated to each hardware thread, and configured to resolve dependencies and control the issue of instructions from instruction buffer 168 to XU 164. In addition, in the illustrated embodiment, separate dependency/issue logic 180 is provided in AXU 166, thus enabling separate instructions to be concurrently issued by different threads to XU 164 and AXU 166. In an alternative embodiment, logic 180 may be disposed in IU 162, or may be omitted in its entirety, such that logic 178 issues instructions to AXU 166.

XU 164 is implemented as a fixed point execution unit, including a set of general purpose registers (GPR's) 182 coupled to fixed point logic 184, branch logic 186 and load/store logic 188. Load/store logic 188 is coupled to an L1 data cache (dCACHE) 190, with effective to real translation provided by dERAT logic 192. XU 164 may be configured to implement practically any instruction set, e.g., all or a portion of a 32 b or 64 b PowerPC instruction set.

AXU 166 operates as an auxiliary execution unit including dedicated dependency/issue logic 180 along with one or more execution blocks 194. AXU 166 may include any number of execution blocks, and may implement practically any type of execution unit, e.g., a floating point unit, or one or more specialized execution units such as encryption/decryption units, coprocessors, vector processing units, graphics processing units, XML processing units, etc. In the illustrated embodiment, AXU 166 includes a high speed auxiliary interface to XU 164, e.g., to support direct moves between AXU architected state and XU architected state.

Communication with IP block 104 may be managed in the manner discussed above in connection with FIG. 2, via network interface controller 108 coupled to NOC 102. Address-based communication, e.g., to access L2 cache memory, may be provided, along with message-based communication. For example, each IP block 104 may include a dedicated in box and/or out box in order to handle inter-node communications between IP blocks.

Embodiments of the present invention may be implemented within the hardware and software environment described above in connection with FIGS. 1-4. However, it will be appreciated by one of ordinary skill in the art having the benefit of the instant disclosure that the invention may be implemented in a multitude of different environments, and that other modifications may be made to the aforementioned hardware and software embodiment without departing from the spirit and scope of the invention. As such, the invention is not limited to the particular hardware and software environment disclosed herein.

Internal Voting-Based BIST

On modern multi-core processor chips and other system-on-a-chips (SOCs) there are typically many duplicate copies of the same processor core, with the number of duplicate copies expected to increase from tens of cores to hundreds of cores or more. It has been found that this duplicate hardware may be leveraged to enable faster, more accurate, hardware BIST. In particular, by scanning the same initial value into multiple cores, clocking the cores, and then scanning the data out and comparing the results, a voting scheme may be used to determine if the hardware is bad. As long as at least three cores are used, a faulty core that has a failing signature may be identified. Furthermore, by comparing those failing signatures, exactly which latch is failing may be identified, and if a failing latch is identified with a particular functional unit, that failing functional unit may also be identified, and if desired, automatically disabled.

In embodiments consistent with the invention, an initial scan into the cores may be initiated through a JTAG port and using on-board Automatic Test Pattern Generation (ATPG) logic to generate a predetermined sequence of test patterns. Alternatively, pseudorandom test patterns may be generated, e.g., using an on-board hardware linear feedback shift register (LFSR). By doing so, testing is isolated from any external tester equipment, and enables testing to be performed off the expensive tester, often at a significantly faster rate than could be accomplished were test patterns and/or test results required to be communicated between the tester and the chip. In some embodiments, testing may also be performed in the field, and after manufacture and packaging of the chip.

By performing this level of testing and automatically determining the failing latches, specific areas of a core that are failing can often be identified. Furthermore, depending on the fail location, a failing core may be configured to avoid that logic either by avoiding instructions, disabling functional units or areas of a functional unit (e.g., for a memory array such as an on-board cache), or enabling an internal patch processor to work around failing logic components.

Moreover, in some embodiments, the herein-described BIST process may be run in parallel across many groups of cores in the design. By having the hardware output voting and compare, the dependency on pre-silicon test pattern generation and testing may be reduced because there is often no requirement to have pre-computed output test patterns. This also may enable more test patterns to be generated, or test patterns to be changed on the fly to enhance testing of specific parts of the design.

Figure 5:
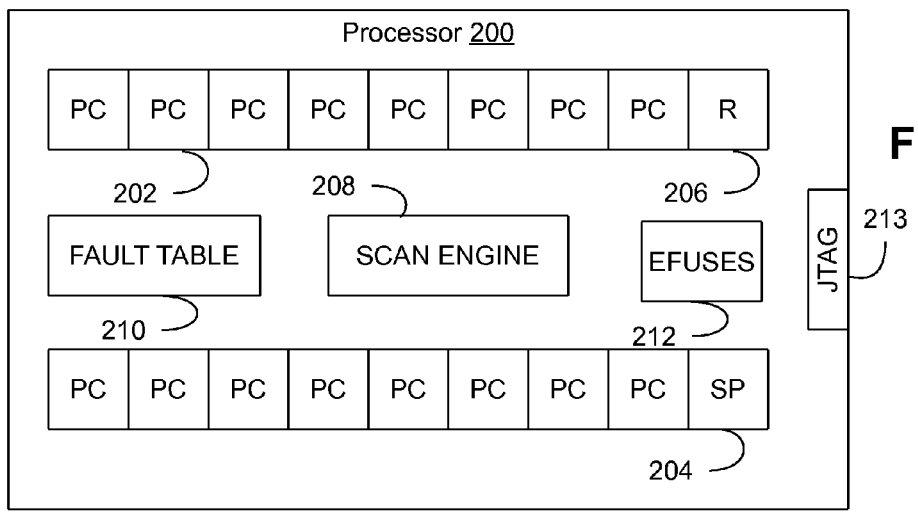
FIG. 5 is a block diagram of an exemplary multi-core processor chip incorporating internal voting-based BIST consistent with the invention.

Turning now to FIG. 5, a data processing system is illustrated incorporating a multi-core processor chip 200 including a plurality of processing cores 202. As illustrated in this figure, some processing cores may be designated for special purposes, e.g., a service processor 204, and some processing cores may be unused or spare, as with redundant core 206. In one embodiment of the invention, for example, it may be desirable to fabricate 18 processing cores on chip 200 with the intent of having 16 functional cores and one service processor in active use, along with one inactive spare core. Then, during BIST, if any processing core is determined to be faulty, that core can be deactivated and the spare core activated for use as a functional core. Also, in the event that any functional core is determined to be partially faulty, e.g., where a floating point or other auxiliary functional unit is determined to be faulty, but the core is otherwise suitable for use as a service processor, that partially-faulty core may be used as a service processor if necessary. It will be appreciated that different numbers of functional cores, spare cores, service processors, etc. may be implemented without departing from the spirit and scope of the invention.

To implement internal voting-based BIST consistent with the invention, processor chip 200 includes scan logic including, for example, a scan engine 208, a fault table 210 and one or more electronic fuses 212. In addition, a conventional test port 213, e.g., implemented using the Joint Test Automation Group (JTAG) standard, may be used to provide external access to the scan logic, e.g., to external test equipment.

Figure 6:
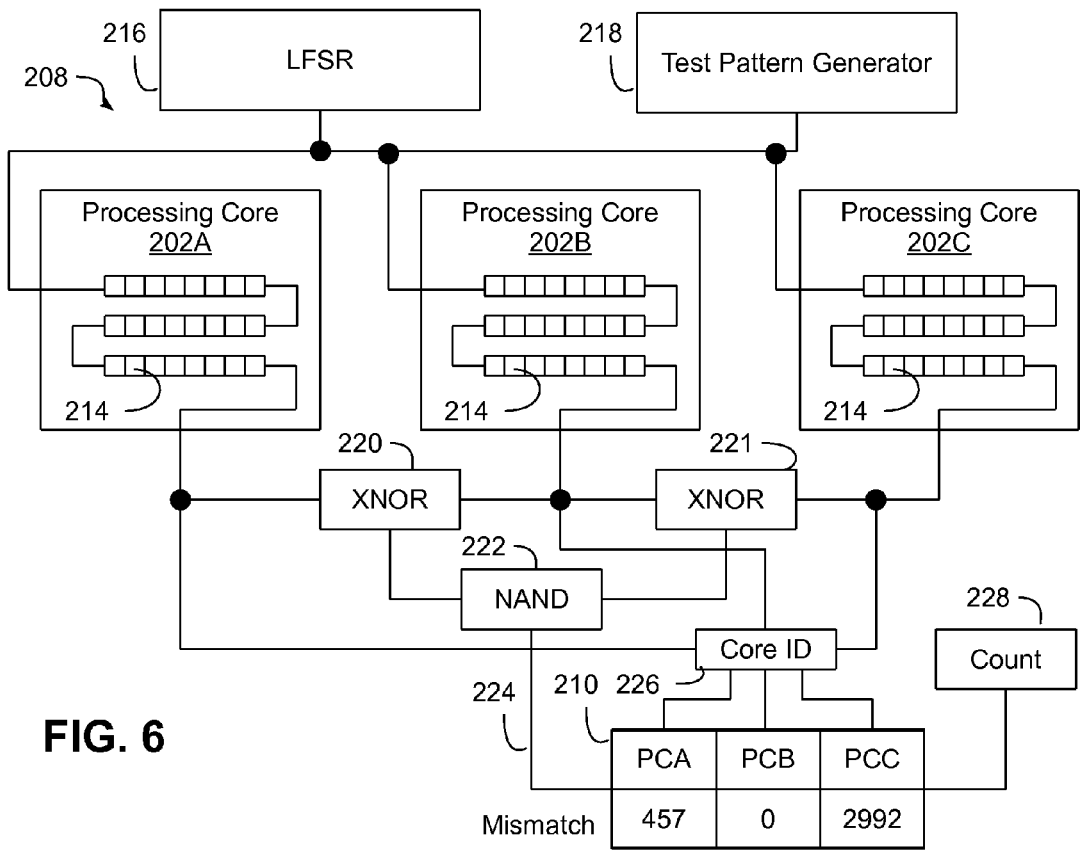
FIG. 6 is a block diagram of an exemplary implementation of the scan engine referenced in FIG. 5.

FIG. 6 illustrates one exemplary implementation of a portion of scan engine 208. In this implementation, scan engine 208 is configured to test processing cores 202 in groups of three, and as such, connections to inputs and outputs of scan chains 214 in each of three processing cores 202A, 202B and 202C are illustrated in the figure. Each scan chain 214 typically includes a plurality of latches, which may be grouped together and may otherwise be dispersed among a plurality of functional units in each processing core. It will be appreciated that for a processor chip including three processing cores, FIG. 6 would implement all of the comparison logic required to perform internal voting-based BIST for that chip. For a processor chip including more than three processing cores, at least a portion of scan engine 208 illustrated in FIG. 6 may be replicated to handle other groups of three processing cores. In the alternative, the test results of more than three processing cores may be compared to identify faulty processing cores and latches therein.

Moreover, in this implementation, the scan chains are serial scan chains having a single bit input and a single bit output permitting data to be scanned into and out of the scan chain at a rate of one bit per clock cycle. It will be appreciated, however, that the invention is not limited to the particular scan chain implementations disclosed herein.

Scan engine 208 may include one or both of an LFSR 216 and a deterministic test pattern generator 218 coupled to output the same test pattern to the input of the scan chain 214 of each processing core 202A-C. The former may be used to generate pseudorandom test patterns while the latter may be used to generate a deterministic sequence of test patterns. In some embodiments, only one of LFSR 216 and generator 218 is utilized. A deterministic sequence of test patterns may be useful, for example, to apply test patterns that have been specifically designed for the particular processor architecture to ensure an efficient and thorough test of the design. A pseudorandom test, on the other hand, may be more brute force in nature, but it will be appreciated that since the testing occurs internally within the processor chip, and does not rely on any external test equipment, the speed in which testing may be performed will be significantly faster, so a significantly larger number of test patterns may be applied in the same timeframe as might otherwise be applied via external test equipment, so sufficient test coverage can still be obtained in many instances through the use of pseudorandom test patterns. It will also be appreciated that a single test pattern generator may be applied to all processing cores in a processor chip, or that different test pattern generators may be used for different groups of processing cores.

In this implementation, fault table 210 is implemented as a data structure that stores, for each processing core, the location of the first faulty latch in that core's scan chain. As such, fault table 210 includes at least one storage element respectively associated with processing cores 202A-C, designated respectively in FIG. 6 as PCA, PCB and PCC. It will be appreciated that additional storage elements may be provided for additional processing cores, and that, in some embodiments, fault table 210 may be replicated for other groups of processing cores that are tested in parallel, or a single data structure may be used to store the test results for multiple groups of processing cores.

Scan engine 208 also includes comparison logic, including, for example, a pair of XNOR gates 220, 221 and NAND gate 222 that assert a Mismatch signal 224 in response to any mismatch between the single bit outputs of the scan chains in processing cores 202A-C. XNOR gate 220 performs an Exclusive-NOR operation on the scan chain outputs of processing cores 202A and 202B, while XNOR gate 221 performs an Exclusive-NOR operation on the scan chain outputs of processing cores 202B and 202C. The outputs of XNOR gates 220, 221 are then fed to a NAND gate 222 to assert Mismatch signal 224 to fault table 210 whenever all of the bits output by processing cores 202A-C do not match.

The comparison logic also includes core ID logic 226 that also receives the outputs of processing cores 202A-C and determines which, among the processing cores, is outputting a bit that differs from "consensus" correct bit being output by the majority of processing cores (here, two). Logic 226 outputs three select signals to fault table 210, one for each processing core 202A-C, which is asserted whenever the associated processing core is the outlier, i.e., the faulty processing core for that bit. In addition, a counter 228 is used to generate a value corresponding to or otherwise correlated with a bit position in each scan chain 214 to permit the location of the mismatched bit to be correlated to a latch in the scan chain of a faulty processing core. The value of counter 228 is also output to fault table 210.

Configuration of comparison logic to implement majority voting among any number N of processing cores, to determine an outlier processing core, to determine a consensus correct result from among the N processing cores, and to manage a counter value or other latch/bit position identifier, as well as replication of such logic across multiple groups of processing nodes, would be within the abilities of one of ordinary skill in the art having the benefit of the instant disclosure. As such, the invention is not limited to the particular configuration disclosed herein.

Fault table 210 is configured to, in response to assertion of Mismatch signal 224, store the current value of counter 228 in the storage element corresponding to the outlier processing core 202A-C, as selected by the associated enable signal asserted by core ID logic 226. In this implementation, fault table 210 stores the counter value corresponding to the first faulty latch detected for each processing core 202A-C, and as shown in FIG. 6, processing cores 202A and 202C are identified as being faulty, while processing core 202B is not.

Figure 7:
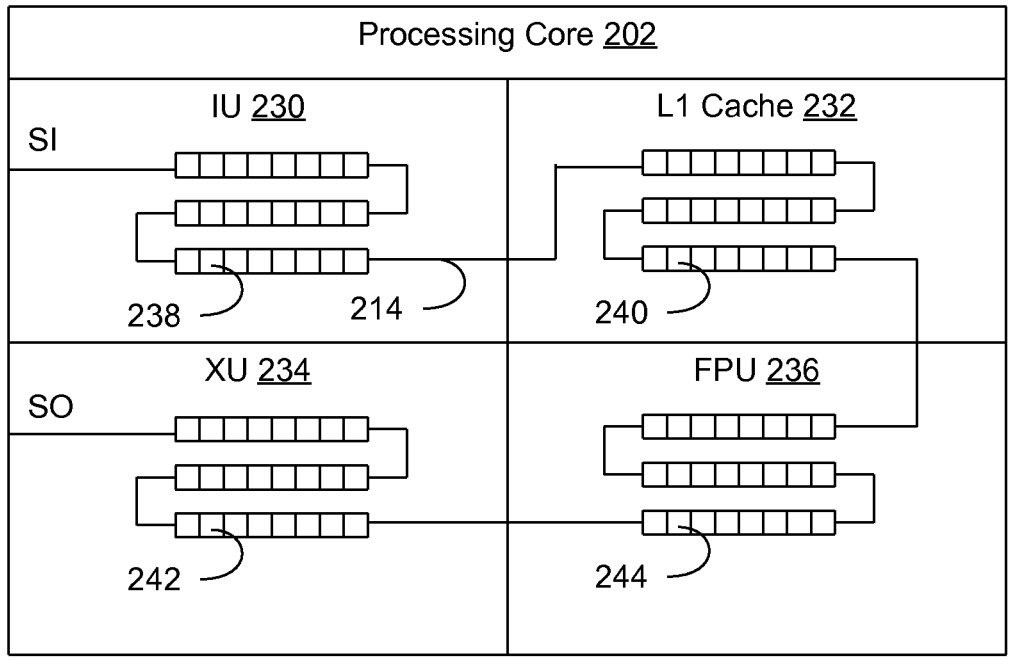
FIG. 7 is a block diagram of an exemplary implementation of one of the processing cores referenced in FIG. 5.

The manner in which counter 228 is correlated to latches in the scan chains may vary in different embodiments. For example, FIG. 7 illustrates an exemplary processing core 202 that includes an instruction or issue unit (IU) 230, L1 cache 232, fixed point execution unit (XU) 234 and floating point execution unit (FPU) 236. In this implementation, scan chain 214 is partitioned into four latch groups 238, 240, 242 and 244 respectively disposed in the IU 230, L1 cache 232, XU 234 and FPU 236. A mapping data structure, e.g., a mapping table 246, may be incorporated into a scan engine to enable the scan engine to determine within which functional unit a particular latch or bit position in the scan chain 214 is disposed. Thus, as shown in FIG. 7, latches/bit positions 1-2000 may correspond to IU 230, latches/bit positions 2001-3000 may correspond to L1 cache 232, latches/bit positions 3001-6000 may correspond to XU 234 and latches/bit positions 6001-10000 may correspond to FPU 236.

By correlating counter 228 (FIG. 6) to the latches/bit positions in scan chain 214, scan engine can, upon detection of a faulty latch in a processing core, map that latch/bit position to a functional unit in processing core 202, and thereby identify a faulty functional unit in a processing core (e.g., returning briefly to FIG. 6, the IU of processing core 202A and the L1 cache of processing core 202C). Moreover, in some embodiments, the knowledge of a faulty functional unit may allow a scan engine to automatically disable that functional unit or the processing core, or otherwise seek to automatically reconfigure the processor chip to work around the faulty functional unit. In other embodiments, however, mapping of latches/bit positions to functional units may be implemented in external testing equipment, whereby only latch/bit positions are stored on-board the processor chip and determination of a faulty functional unit is performed off-chip.

Figure 8:
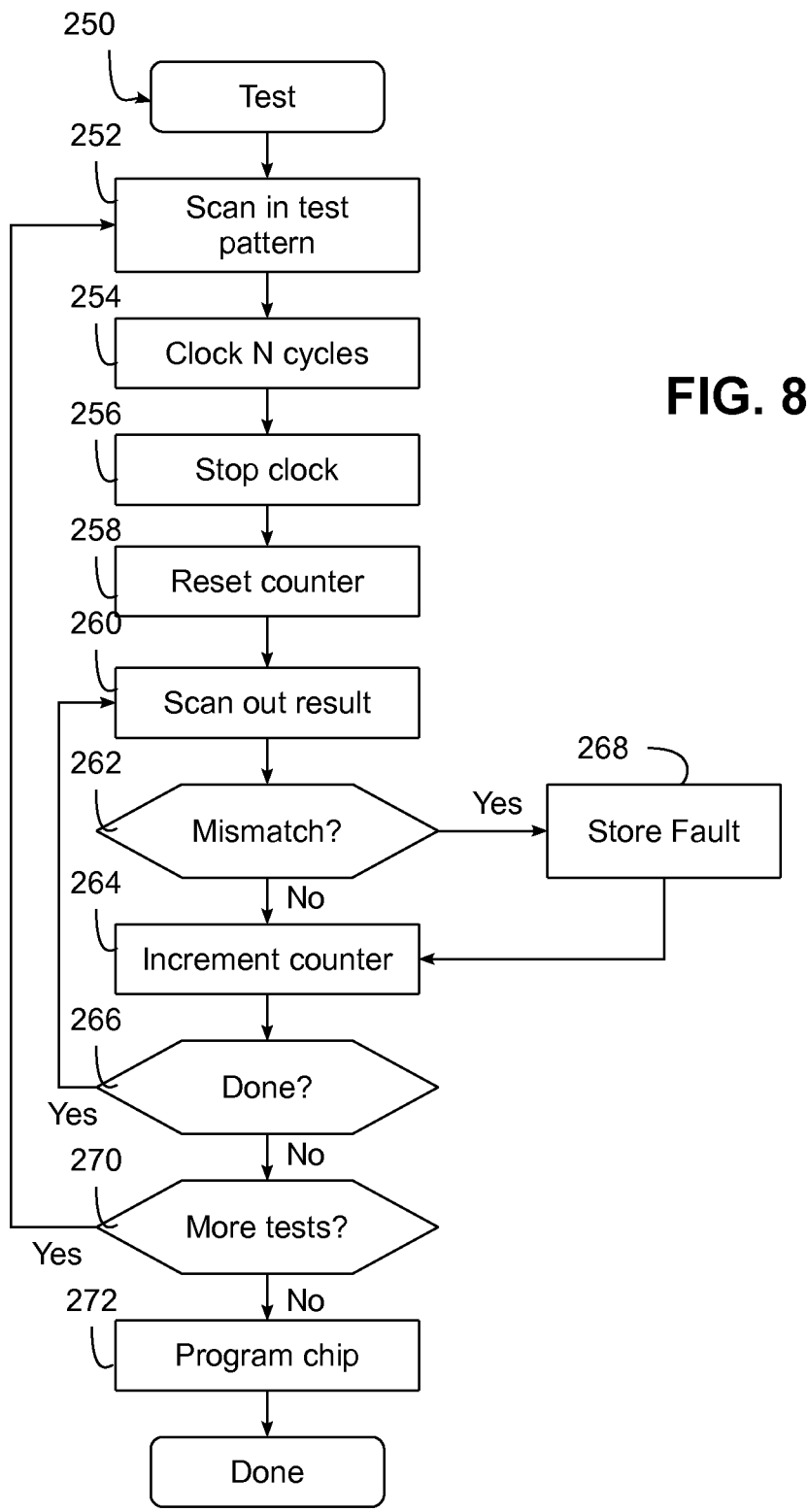
FIG. 8 is a flowchart illustrating an exemplary sequence of operations performed by the multi-core processor chip of FIG. 5 when performing internal voting-based BIST consistent with the invention.

FIG. 8 illustrates an exemplary sequence of operations 250 performed by scan engine 208 of processor chip 200 (FIG. 5) to perform internal voting-based BIST consistent with the invention. In this implementation, it is presumed that all processing cores receive the same test patterns. As such, in block 252, a test pattern, whether a pseudorandom test pattern or a predetermined test pattern, is scanned or clocked into the scan chains of all of the processing cores. Next, the processing cores are clocked N (one or more) cycles (block 254) to test the response of the processing cores to the input test pattern, and after N clock cycles, the clock is stopped in block 256.

Next, in block 258, the bit position counter is reset to a value corresponding to the first latch or bit position to be output from the scan chains. Then, in block 260, the test results are clocked or scanned out bit-by-bit from the scan chains in each of the processing cores to perform a bit-by-bit comparison thereof. So long as all of the bits output from the scan chains match one another, block 262 passes control to block 264 to increment (or, if appropriate, decrement) the counter to a value corresponding to the next latch/bit position in the scan chain. Block 266 then returns control to block 260 to continue to scan out results. However, in response to any mismatch among test result bits by the comparison logic in the scan engine, block 262 passes control to block 268 to store the fault in the fault table, e.g., by storing the current counter value in the storage element corresponding to the outlier processing core. Control then passes to block 264 to update the counter and continue to scan out test results.

Once all of the bits of the test results have been scanned out, block 266 passes control to block 270 to determine whether additional test patterns remain to be applied. For pseudorandom test patterns, block 270 may halt testing after a predetermined number of test patterns. For a predetermined sequence of test patterns, block 270 may halt testing once all of the test patterns in the desired sequence have been applied. Thus, if additional test patterns need to be applied, block 270 returns control to block 252 to scan in a new test pattern.

Once all test patterns have been applied, however, testing is complete and block 270 optionally passes control to block 272 to program the chip. Programming the chip typically includes either automatically disabling portions of the chip, or storing data that can be retrieved by external testing equipment and used to later disable portions of the chip, or to scrap the chip entirely.

Programming the chip may include, for example, accessing a mapping table and automatically disabling any faulty functional unit in a processing core identified as faulty. Programming may also include disabling a processing core entirely and/or remapping another processing core (e.g. a spare or redundant core) to handle the functions originally assigned to the faulty processing core. Programming may also include selecting a faulty processing core to handle a specialized task, e.g., to function as a service processor. It will be appreciated that different actions may be taken in response to faults detected in different functional units in a processing core, e.g., a processing core may still be able to function in a reduced capacity without a floating point unit, but may be completely unusable without an issue unit.

It will also be appreciated that functional units may be defined at different levels of granularity. For example, a cache or other on-board memory may be partitioned into multiple functional units so that, for example, if a particular portion of the cache is found to be faulty, the cache may still be active, but with a reduced size due to a portion of the cache being identified as faulty. As another example, different portions of an execution unit may handle different types of instructions, and a fault in one portion of an execution unit may result in only that portion being disabled, and with the processing core trapping to software for any instructions that are handled by that portion of the execution unit, while still being enabled for handling other types of instructions. Also, functional units may be defined hierarchically, and certain functional units may be contained in other functional units. Thus, for example, a branch prediction unit in an issue unit may be identified as faulty, but still allow the issue unit to operate with the branch prediction unit disabled.

Programming the chip may also include storing test results in non-volatile memory, e.g., by storing fault codes or an identification of faulty latches, functional units and/or processing cores. The non-volatile memory may be implemented, for example, as electronic fuses, or in other manners known in the art.

It will also be appreciated that other data structures may be used to store fault data consistent with the invention. For example, a fault table may be implemented with electronic fuses such that only the first faulty latch in each processing core will be identified. In the alternative, a fault table or other data structure may store a plurality of entries mapping each detected fault (including multiple faults detected in a given processing core) to a particular processing core and/or functional unit. A data structure may also store a functional unit identifier rather than a counter value, or may simply identify which, if any, processing cores are faulty. A fault data structure may also double as an enable circuit such that the logging of a fault in a functional unit and/or processing core may result in setting the flag for that functional unit and/or processing core that indicates whether that particular unit/core is enabled or disabled.

Embodiments consistent with the invention therefore provide a number of advantages over conventional testing methodologies. By implementing BIST internally in a processor chip, testing may be performed significantly faster than would be possible if test patterns and/or test results had to be communicated between the chip and external testing equipment. In many manufacturing environments, the longer individual processor chips sit on external testing equipment, the lower the throughput and the greater the manufacturing cost, and reducing this time improves throughput and lowers per unit cost. By implementing voting or comparison logic, the "correct" results for given test patterns need not be simulated or otherwise determined in advance, because correctness is merely based on what the majority of processing cores output as their respective results. Furthermore, by identifying faulty processing cores and/or faulty functional units, many chips containing faulty processing cores and/or functional units may still be reconfigured to operate in a reduced capacity, rather than being scrapped in their entirety.

Various modifications may be made to the disclosed embodiments without departing from the spirit and scope of the invention. Therefore, the invention lies in the claims hereinafter appended.

What is claimed is:

1. A circuit arrangement, comprising:
a plurality of processing cores disposed on a multi-core integrated circuit device, each processing core including a scan chain; and
scan logic disposed on the multi-core integrated circuit device and configured to communicate a test pattern to the scan chains of the plurality of processing cores and compare test results output by the scan chains of the plurality of processing cores in response to the test pattern, wherein the scan logic is further configured to identify a faulty processing core among the plurality of processing cores based upon the test result output by the scan chain of the faulty processing core differing from a majority of the test results output by the plurality of processing cores, wherein the plurality of processing cores comprises a plurality of subsets, wherein each subset among the plurality of subsets includes at least three processing cores from among the plurality of processing cores, the scan chains of the at least three processing cores in each subset among the plurality of subsets configured to output test results to the scan logic in parallel with one another and in response to the test pattern, and wherein the scan logic is configured to perform a plurality of comparisons in parallel with one another, wherein each comparison compares the test results output in parallel by the scan chains of the at least three processing cores in a respective subset among the plurality of subsets such that the plurality of comparisons of test results for the processing cores in each of the plurality of subsets are performed in parallel, and wherein the plurality of subsets are tested in parallel.

2. The circuit arrangement of claim 1, wherein the scan chains are serial scan chains, and wherein the scan logic is configured to perform a bit-by-bit comparison of the test results output by the scan chains of the plurality of processing cores.

3. The circuit arrangement of claim 2, wherein the scan chains each include a plurality of latches coupled to one another in series, and wherein the scan logic is further configured to identify a faulty latch in the faulty processing core based upon a position of a bit in the test result that differs from the majority of test results output by the plurality of processing cores.

4. The circuit arrangement of claim 3, wherein the scan chains are each configured to output the test results one bit at a time, and wherein the scan logic is configured to increment a counter in association with receiving each bit of the test results, and to use the counter to identify the faulty latch.

5. The circuit arrangement of claim 4, further comprising a fault data structure, wherein the scan logic is configured to store a value of the counter in the fault data structure in association with identifying a bit in the test result of the faulty processing core that differs from the majority of test results output by the plurality of processing cores.

6. The circuit arrangement of claim 5, wherein the fault data structure includes a plurality of storage elements, each storage element associated with a processing core among the plurality of processing cores, and wherein the scan logic is configured to store the value of the counter in the storage element associated with the faulty processing core.

7. The circuit arrangement of claim 6, wherein the fault data structure includes a plurality of entries, wherein the scan logic is configured to, in response to each fault detected in any of the plurality of processing cores, store a counter value associated with the fault in an entry in the fault data structure.

8. The circuit arrangement of claim 5, wherein the fault data structure comprises a plurality of electronic fuses.

9. The circuit arrangement of claim 3, wherein the plurality of latches in the scan chain of each processing core are disposed in a plurality of functional units of the processing core, and wherein the scan logic is configured to identify a faulty functional unit in response to identifying the faulty latch.

10. The circuit arrangement of claim 9, wherein the scan logic is configured to automatically disable the faulty functional unit in response to identifying the faulty functional unit.

11. The circuit arrangement of claim 10, wherein the scan logic is configured to automatically disable the faulty functional unit by blowing an electronic fuse associated with the faulty functional unit.

12. The circuit arrangement of claim 3, wherein the scan logic is configured to communicate a plurality of test patterns to the plurality of processing cores, and wherein the scan logic is configured to, for each test pattern:
clock the test pattern into the scan chains of the plurality of processing cores;
clock the plurality of processing cores for a plurality of clock cycles; and
clock the test results out of the scan chains of the plurality of processing cores.

13. The circuit arrangement of claim 12, wherein the scan logic includes pseudorandom logic configured to generate a plurality of pseudorandom test patterns.

14. The circuit arrangement of claim 12, wherein the scan logic is configured to communicate a predetermined sequence of test patterns to the plurality of processing cores.

15. The circuit arrangement of claim 1, wherein the scan logic is configured to compare test results output by the scan chains of all of the processing cores disposed on the multi-core integrated circuit device.

16. The circuit arrangement of claim 1, wherein the scan logic includes a plurality of instances, each instance configured to perform a comparison among the plurality of comparisons for a respective subset among the plurality of subsets.

17. An integrated circuit device including the circuit arrangement of claim 1.

18. A program product comprising a non-transitory computer readable medium and logic definition program code stored on the computer readable medium and defining the circuit arrangement of claim 1.

19. A method of performing built in self test (BIST) of a multi-core integrated circuit device including a plurality of processing cores, wherein each processing core includes a scan chain, the method comprising:
communicating a test pattern to the scan chains of the plurality of processing cores using scan logic disposed on the multi-core integrated circuit device;

comparing test results output by the scan chains of the plurality of processing cores in response to the test pattern using the scan logic; and identifying a faulty processing core among the plurality of processing cores based upon the test result output by the scan chain of the faulty processing core differing from a majority of the test results output by the plurality of processing cores;

wherein the plurality of processing cores comprises a plurality of subsets, wherein each subset among the plurality of subsets includes at least three processing cores from among the plurality of processing cores, the scan chains of the at least three processing cores in each subset among the plurality of subsets configured to output test results to the scan logic in parallel with one another and in response to the test pattern, wherein the scan logic is configured to perform a plurality of comparisons in parallel with one another, wherein each comparison compares the test results output in parallel by the scan chains of the at least three processing cores in a respective subset among the plurality of subsets, wherein comparing test results comprises performing the plurality of comparisons of test results for the processing cores in each of the plurality of subsets in parallel, and wherein the plurality of subsets are tested in parallel.

20. The method of claim 19, wherein the scan chains are serial scan chains, wherein comparing test results includes performing a bit-by-bit comparison of the test results output by the scan chains of the plurality of processing cores, wherein the scan chains each include a plurality of latches coupled to one another in series, and wherein the method further comprises identifying a faulty latch in the faulty processing core based upon a position of a bit in the test result that differs from the majority of test results output by the plurality of processing cores.

21. The method of claim 20, further comprising storing a value associated with the bit position in a fault data structure.

22. The method of claim 21, wherein the plurality of latches in the scan chain of each processing core are disposed in a plurality of functional units of the processing core, the method further comprising identifying a faulty functional unit in response to identifying the faulty latch.

23. The method of claim 22, further comprising automatically disabling the faulty functional unit with the scan logic in response to identifying the faulty functional unit.

24. The method of claim 19, further comprising generating a plurality of pseudorandom test patterns with the scan logic and communicating the plurality of pseudorandom test patterns to the plurality of processing cores.

25. The method of claim 19, further comprising generating a plurality of predetermined sequence of test patterns with the scan logic and communicating the predetermined sequence of test patterns to the plurality of processing cores.

\* \* \* \* \*